US 6,566,279 B2

(12) United States Patent
Suemitsu et al.

(10) Patent No.: US 6,566,279 B2
(45) Date of Patent: May 20, 2003

(54) METHOD FOR FABRICATING A SIC FILM AND A METHOD FOR FABRICATING A SIC MULTI-LAYERED FILM STRUCTURE

(75) Inventors: Maki Suemitsu, Sendai (JP); Hideki Nakazawa, Sendai (JP)

(73) Assignee: Tohoku University, Sendai (JP)

( * ) Notice: Subject to any disclaimer, the term of this patent is extended or adjusted under 35 U.S.C. 154(b) by 0 days.

(21) Appl. No.: 09/938,584

(22) Filed: Aug. 27, 2001

(65) Prior Publication Data

US 2002/0102862 A1 Aug. 1, 2002

(30) Foreign Application Priority Data

Feb. 1, 2001 (JP) ......................................... 2001-025523

(51) Int. Cl.$^7$ ........................ H01L 21/31; H01L 21/469
(52) U.S. Cl. ........................................ 438/778; 438/781
(58) Field of Search ................................. 438/778, 781, 438/483; 117/88, 92, 84, 101, 902; 427/248.1, 249, 255; 423/345, 346

(56) References Cited

U.S. PATENT DOCUMENTS 5,313,078 A * 5/1994 Fujii et al. ...................... 257/77
5,677,236 A * 10/1997 Saitoh et al. .................. 438/485

* cited by examiner

Primary Examiner—George Fourson
Assistant Examiner—Hsien-Ming Lee
(74) Attorney, Agent, or Firm—Oliff & Berridge, PLC

(57) ABSTRACT

An organic silicon gas having Si—H bond and Si—C bond is supplied onto a Si-contained base material, to form a SiC film on a main surface of the base material. Moreover, An organic silicon gas having Si—H bond and Si—C bond is supplied onto a Si-contained base material, to form a SiC underfilm. Then, a SiC film is formed on the SiC underfilm to fabricate a SiC multi-layered film structure.

18 Claims, 5 Drawing Sheets

US 6,566,279 B2

METHOD FOR FABRICATING A SIC FILM AND A METHOD FOR FABRICATING A SIC MULTI-LAYERED FILM STRUCTURE

BACKGROUND OF THE INVENTION

1. Field of the Invention

This invention relates to a method for fabricating a SiC film and a SiC multi-layered film structure, particularly usable for various environment-resistance device and various semiconductor device.

2. Description of the Prior Art

SiC material has a larger bandgap, a larger electric field for dielectric breakdown, a larger saturated drift velocity and a larger thermal conductivity than Si material, so that it can be expected to be used for an environment-resistance device under a high temperature atmosphere and a large radiation atmosphere, in which a given device made of Si material or GaAs material can not be employed, and for a high frequency- or a high power-semiconductor device.

Moreover, the SiC material can be also expected for a substrate for GaN devices such as a microwave device and a blue-violet laser. That is why a given electrode can be easily formed on the back surface of the substrate because the SiC material has a relatively large electric conductivity and the substrate made of the SiC material has a large thermal emission capacity due to the large thermal conductivity. Furthermore, a given resonance mirror can be easily fabricated through the cleave of the SiC material and the SiC material has its lattice constant almost equal to a GaN-based semiconductor material (the difference in lattice constant between the SiC material and the GaN based material is about 3%).

Conventionally, a SiC substrate was made by a sublimation method or a hetero-epitaxy method for a Si substrate. However, the SiC substrate made by the sublimation method was likely to have much throughout hole defects called as micropipes. Moreover, the sublimation method has difficulty in fabricating a large sized SiC substrate.

On the other hand, the hetero-epitaxy method can make a large sized SiC film on a Si wafer at low cost, and thus, can make a large sized SiC substrate. However, the difference between the SiC film and the Si wafer comes up to about 20%, so that it is required that a SiC underfilm having much clystallographical information of the Si wafer is formed, heading to forming the SiC film.

The SiC underfilm is made by a so-called carbonization method. In this case, the Si substrate (Si wafer) is heated to about 900° C. or over, with supplying hydrocarbon gas having only carbon source onto the Si substrate. Just then, the Si elements of the Si substrate and the carbon elements of the hydrocarbon gas are reacted on the surface of the Si substrate, and thus, a thin underfilm made of a SiC single crystal is fabricated on the Si substrate.

However, the carbonization method may make much hollow voids in the Si substrate and deteriorate the flatness of the interface between the SiC underfilm and the Si substrate due to the outdiffusion of the Si elements. Therefore, the crystallinity of the SiC underfilm is deteriorated and as a result, the flatness of the SiC underfilm is deteriorated. Accordingly, the crystallinity and the flatness of the SiC film to be fabricated on the SiC underfilm are deteriorated, so that a SiC substrate having favorable physical properties can not be provided.

SUMMARY OF THE INVENTION

It is an object of the present invention to provide a method for fabricating a SiC film with good crystallity and flatness without the step of thermally treating at a high temperature, and to provide a method for fabricating a SiC multilayered film structure including the step of forming a SiC underfilm with the above fabricating method of a SiC film.

For achieving the above object, this invention relates to a method for fabricating a SiC film comprising the steps of:

preparing a Si-contained base material and supplying an organic silicon gas having Si—H bond and Si—C bond onto a main surface of the Si-contained base material, thereby to form a SiC film on the main surface.

The inventors have intensely studied to obtain a new fabricating method for a SiC film without the thermal treatment at a high temperature. Then, they have developed various fabricating methods and varied the fabricating conditions in each of the fabricating methods. As a result, they have found out that the use of an organic silicon gas having Si—H bond and Si—C bond, as a substitute for the conventional hydrocarbon gas, can make a SiC film with good crystallinity and flatness without the step of thermally treating the base material at a high temperature on which the SiC film is formed.

According to the present invention, it is not required that the base material containing Si element is heated to a high temperature of 900° C. or over. Therefore, the deterioration of the flatness and the crystallinity of the SiC film due to the hollow voids and outdiffusion of the Si element in the base material can be repressed, so that a SiC film with excellent crystallinity and flatness can be provided.

In the present invention, the thermal treatment for the base material is not always excluded. Preferably, the base material is heated to a temperature of 800° C. and below, particularly to a temperature within 450–650° C. In this case, the flatness of the thus obtained SiC film can be developed with maintaining the high crystallinity.

The fabricating method of the present invention can be preferably applied for a SiC multi-layered film structure such as a SiC substrate. That is, the above SiC film is formed as a SiC underfilm on a main surface of a Si-contained base material, and the fabricating method of the present invention is characterized in that an organic silicon gas having Si—H bond and Si—C bond is supplied onto the main surface of the base material and thus, the SiC underfilm is fabricated on the main surface.

According to the fabricating method of a SiC multi-layered film structure of the present invention, the crystallinity and the flatness of the SiC underfilm can be developed and thus, those of a SiC film to be formed on the SiC underfilm can be also developed.

As a result, a SiC substrate having good crystallinity and flatness can be provided.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
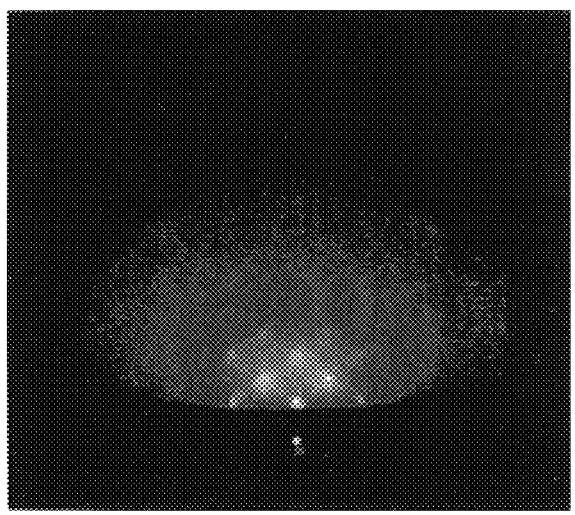
FIG. 1 is a reflection high-energy electron diffraction (RHEED) pattern of a SiC underfilm fabricated using the present invention.

This invention will be described in detail with reference to the accompanying drawings.

In the present invention, it is required to use the above organic silicon gas having Si—H bond and Si—C bond therein. Any kind of organic silicon gas can be employed only if the crystallinity and the flatness of the SiC film can be developed according to the present invention.

Preferably, a monosilane-based gas such as monomethylsilane, monoethylesilane and monopropylsilane can be employed. Since such a monosilane-based molecule can be easily resolved and has a larger reactivity, the crystallinity and the flatness of the SiC film can be easily developed. Moreover, in the case of preferably requiring heating process for the base material on which the SiC film is formed, the heating temperature can be decreased.

Among the above monosilane-based gases, monomethylsilane is preferably employed because it has very large reactivity and thus, can provide the SiC film having good crystallinity and the flatness.

The above organic silicon gas is supplied onto the Si-contained base material set in a reactor, for example, under $1 \times 10^{-5}$ Torr–$1 \times 10^{-4}$ Torr. In real case, however, the gas supplying condition depends on the shape and size of the reactor and the relative arrangement between the base material and the gas introducing position.

As mentioned above, it is desired that the Si-contained base material is heated to 800° C. or below, particularly 450–650° C. In this case, the flatness of the SiC film can be enhanced with maintaining the good crystallinity. The thermal treatment can be carried out by using a heater built-in a holder for the base material or an infrared heater arranged above the base material.

In the case of performing the above thermal treatment, the Si-contained base material is set in a given reactor, and is heated to a temperature of 800° C. or below. Then, the above organic silicon gas such as a monosilane-based gas is introduced into the reactor and supplied onto the base material, thereby to form the SiC film.

Moreover, after the Si-contained base material is set onto the reactor, the organic silicon gas can be introduced and adsorbed on the main surface of the base material in saturation before the thermal treatment. In this case, the SiC film having its enhanced flatness can be fabricated through the subsequent thermal treatment.

If the organic silicon gas is adsorbed onto the base material in saturation, the main surface of the base material can be kept clean without impurities except the Si elements and the C elements of the SiC film to be fabricated. Therefore, it is desired to adsorb the organic gas onto the main surface of the base material in saturation after the base material is set in the reactor and before the thermal treatment is carried out.

Herein, the Si-contained base material may be heated to a low temperature where the SiC is not formed.

As the above Si-contained base material, a Si member, a SiC member, a SiGe member and a SiGeC member may be exemplified. Particularly, the Si member is preferably employed because it can be easily fabricated in large size and low cost, and thus, it may be preferably used for producing a SiC substrate for semiconductor-device applications.

Moreover, the Si-contained base material may be made of a polycrystal in addition to a single crystal of the above Si-contained member.

The above-mentioned fabricating method can be employed for a SiC multi-layered film structure including a SiC film. In this case, a SiC underfilm is formed on a given Si-contained base material according to the above-mentioned requirements and preferred conditions. That is, the SiC underfilm is formed by the fabricating method of the present invention. Thereafter, one-, two-, or multilayered SiC film is formed on the SiC underfilm to fabricate the SiC multi-layered film structure.

For example, the SiC film is formed by using the organic silicon gas such as the monosilane-based gas at a temperature of 900–1000° C.

As will be described in detail hereinafter, a one-layered SiC film with a thickness of 350 Å formed on the SiC underfilm has a high crystallinity as represented in a half width of X-ray diffraction from its (200) plane of 0.68 degree or below.

If the Si member is employed as the Si-contained base material, the SiC multi-layered film structure composed of the Si substrate, the SiC underfilm and the SiC film can be provided. As mentioned above, the SiC film can have its good crystallinity and flatness, so that the SiC multi-layered film structure can be preferably applied for a SiC substrate composing semiconductor devices.

EXAMPLE

In this example, a SiC multi-layered film structure was fabricated by the above-mentioned fabricating process.
(Formation of a SiC Underfilm)

First of all, a Si(100) single crystalline member was set into a reactor and flush-annealed for 20 minutes through the thermal treatment of 1000° C. to clean the main surface of the Si single crystalline member. Then, a monomethylsilane gas was introduced into the reactor up to a pressure of $5.0 \times 10^{-5}$ Torr with heating the Si single crystalline member at 300° C., and was adsorbed onto the main surface for 10 seconds in saturation.

Then, the Si single crystalline member was heated to 650° C. for five minutes to form a SiC underfilm on the main surface.

FIG. 1 is a RHEED pattern of the SiC underfilm. In FIG. 1, only the spots from a cubic SiC single crystal are observed, and thus, it is turned out that the SiC underfilm is of the cubic SiC single crystal uniformly covering the Si single crystalline member. That is, it is turned out that the SiC underfilm can be made at a lower temperature by about 250° C. or over, compared with a conventional carbonizing method where the Si single crystalline member is to be heated to 900° C. or over.
(Formation of a SiC Film)

Subsequently, the Si single crystalline member was heated to 900° C. with keeping the pressure of $5.0 \times 10^{-5}$ Torr of the monomethylsilane gas and held for 60 minutes at the same condition to form a SiC film on the SiC underfilm.

Figure 2:
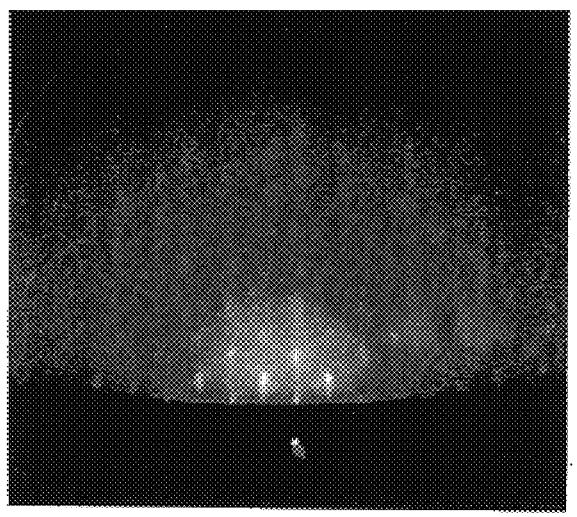
FIG. 2 is a RHEED pattern of a SiC film formed on the SiC underfilm fabricated using the present invention.

FIG. 2 is a RHEED pattern of the SiC film. As is apparent from FIG. 2, the SiC film is made of the cubic SiC single crystal. Moreover, it is turned out that the SiC film has its good flatness because the (1×1) spots are streaked in the <001> direction.

Figure 3:
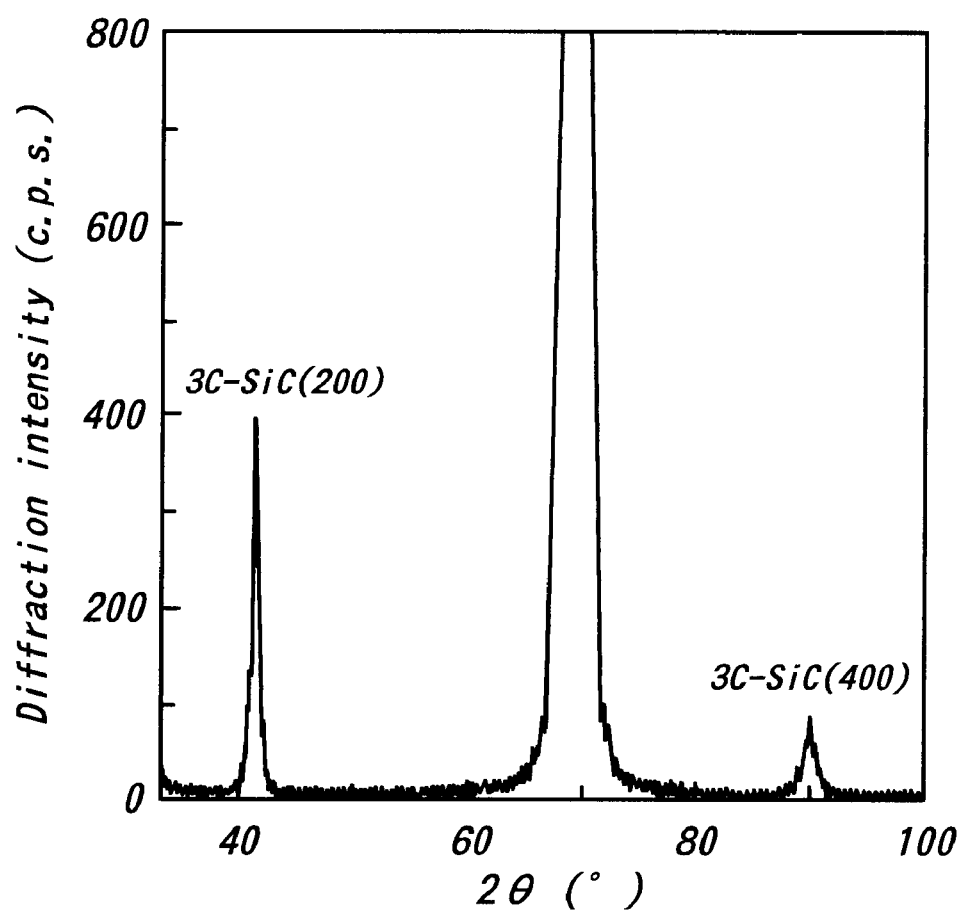
FIG. 3 is an X-ray diffraction pattern of the SiC film formed on the SiC underfilm fabricated using the present invention, FIG. 4 are infrared absorption spectra of the SiC film formed on the SiC underfilm fabricated using the present invention and a SiC film formed, according to a conventional method, directly on a Si single crystalline substrate.

FIG. 3 is an X-ray diffraction pattern of the SiC film. As is apparent from FIG. 3, the diffraction peak from the (200) plane of the cubic SiC single crystal is observed at 41.36 degree, and the diffraction peak from the (400) plane of the cubic SiC single crystal is observed at 90.1 degree. As a result, it is turned out that the SiC film almost maintains the crystal structure of the Si single crystalline member. The half width from the (200) plane is about 0.68 degree (at a thickness of 350 Å).

Figure 4:
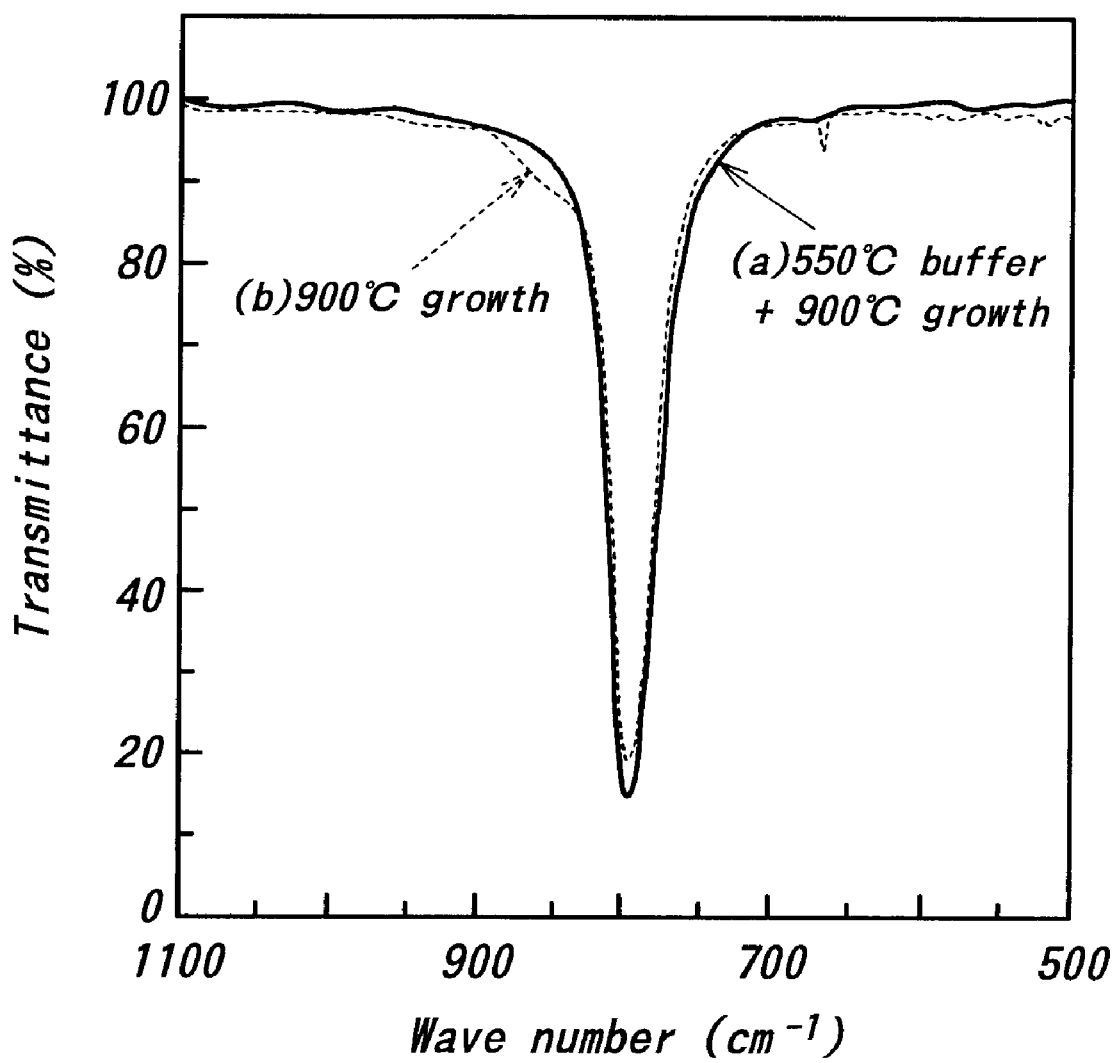

FIG. 4 shows an infrared absorption spectra from the SiC film, compared with that of a conventional SiC film formed directly on the Si single crystalline member at 900° C. without the SiC underfilm. The graph (a) depicts the absorption spectrum of the SiC film fabricated in this example, and the graph (b) depicts the absorption spectrum of the conventional SiC film.

As is apparent from the graph (a), the SiC film in this example has a symmetric peak (795 cm$^{-1}$) from optical phonon absorption based on the cubic SiC single crystal, and thus, it is turned out that the SiC film has a good crystallinity without strain in the film.

On the other hand, as is apparent from the graph (b), the SiC film directly formed has other extra peaks within a region of 850–950 cm$^{-1}$. The extra peaks are due to the boundary disorder between the Si single crystalline member and the SiC film as well as the defects generated from the boundary disorder.

Figure 5:
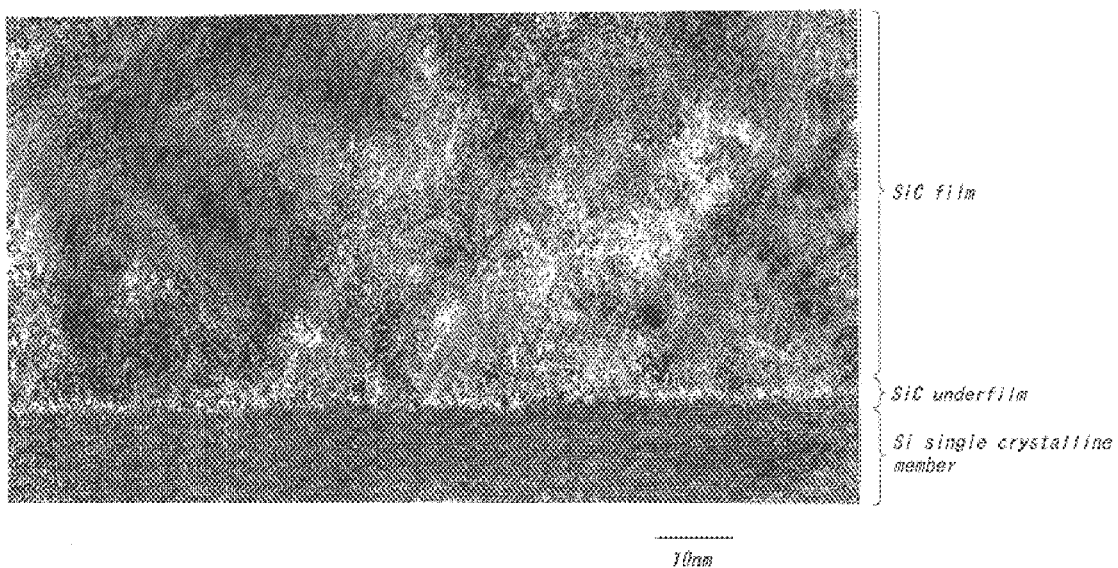
FIG. 5 is a TEM photograph of the cross section of the above thus obtained SiC multi-layered film structure fabricated using the present invention.
Figure 6:
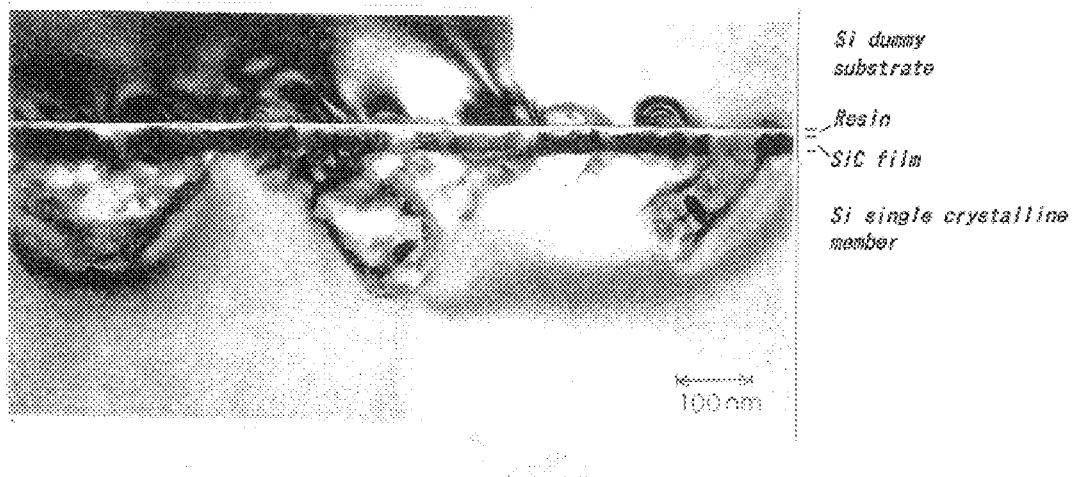
FIG. 6 is a TEM photograph of a SiC multi-layered film structure fabricated using a conventional carbonization method.

FIG. 5 is a TEM photograph of the cross section of the thus obtained SiC multilayered film structure, and FIG. 6 is a TEM photograph of the cross section of a SiC multi-layered film structure made by a conventional carbonization method using an acetylene gas.

As is apparent from FIG. 5, the SiC multi-layered film structure in this example has an atomically flat interface between the Si single crystalline member and the SiC underfilm without voids. On the other hand, as is apparent from FIG. 6, the SiC multi-layered film structure made by the conventional carbonization method has some large voids at the interface between the Si single crystalline member and the SiC film.

That is, the SiC multi-layered film structure having remarkably flat boundary can be provided in this example.

Although the present invention was described in detail with reference to the above examples, this invention is not limited to the above disclosure and every kind of variation and modification may be made without departing from the scope of the present invention.

As is explained above, according to the present invention, a SiC film can have its good crystallinity and flatness without a high temperature-heating process. Therefore, if a SiC underfilm is fabricated by the SiC film-fabricating method of the present invention, a SiC multi-layered film structure, e.g., a SiC substrate, having good crystallinity and flatness can be provided.

What is claimed is:

1. A method for fabricating a crystalline SiC film comprising the steps of:

preparing a Si-contained base material, and supplying and absorbing an organic silicon gas having Si—H bond and Si—C bond onto a main surface of the Si-contained base material, thereby to form a crystalline SiC film on the main surface.

2. A fabricating method as defined in claim 1, further comprising the step of heating the base material to 800° C. or below.

3. A fabricating method as defined in claim 2, wherein the base material is heated to a temperature within 450–650° C.

4. A fabricating method as defined in claim 1, wherein the organic silicon gas is composed of a monosilane-based gas.

5. A fabricating method as defined in claim 4, wherein the organic silicon gas is composed of monomethylsilane.

6. A fabricating method as defined in claim 1, wherein the base material is made of Si member.

7. A fabricating method as defined in claim 1, further comprising the step of adsorbing the organic silicon gas onto the main surface of the base material in saturation before the SiC film is formed on the main surface thereof.

8. A method for fabricating a crystalline SiC multi-layered film structure comprising the steps of:

preparing a Si-contained base material and supplying and absorbing an organic silicon gas having Si—H bond and Si—C bond onto a main surface of the Si-contained base material, thereby to form a SiC underfilm on the main surface.

9. A fabricating method as defined in claim 8, further comprising the step of heating the base material to 800° C. or below.

10. A fabricating method as defined in claim 9, wherein the base material is heated to a temperature within 450–650° C.

11. A fabricating method as defined in claim 8, wherein the organic silicon gas is composed of a monosilane-based gas.

12. A fabricating method as defined in claim 11, wherein the organic silicon gas is composed of monomethylsilane.

13. A fabricating method as defined in claim 8, wherein the base material is made of Si member.

14. A fabricating method as defined in claim 8, further comprising the step of adsorbing the organic silicon gas onto the main surface of the base material in saturation before the SiC underfilm is formed on the main surface thereof.

15. A fabricating method as defined in claim 8, further comprising the step of forming a SiC film on the SiC underfilm.

16. A fabricating method as defined in claim 15, wherein the SiC film has a half width of X-ray diffraction pattern from (200) plane of 0.68 degree or below.

17. A fabricating method as defined in claim 15, wherein the base material is composed of a Si substrate and thus, the SiC multi-layered film structure constitutes a SiC substrate.

18. A fabricating method as defined in claim 16, wherein the base material is composed of a Si substrate and thus, the SiC multi-layered film structure constitutes a SiC substrate.

* * * * *